United States Patent [19]

Tanigawa

[11] Patent Number: 4,655,600
[45] Date of Patent: Apr. 7, 1987

[54] ALIGNMENT METHOD

[75] Inventor: Tohru Tanigawa, Tenri, Japan

[73] Assignee: Sharp Kabushiki Kaisha, Osaka, Japan

[21] Appl. No.: 768,621

[22] Filed: Aug. 23, 1985

[30] Foreign Application Priority Data

Aug. 27, 1984 [JP] Japan .............................. 59-177877

[51] Int. Cl.⁴ ............................................. G01B 11/27
[52] U.S. Cl. ..................................... 356/401; 358/101
[58] Field of Search .................. 355/53; 356/399, 400, 356/401; 250/557; 358/101

[56] References Cited

U.S. PATENT DOCUMENTS

| | | | |
|---|---|---|---|
| 4,219,719 | 8/1980 | Frosien et al. | 356/401 |
| 4,337,394 | 6/1982 | Fukushima | 356/401 |
| 4,380,395 | 4/1983 | Kuniyoshi et al. | 356/401 |
| 4,538,914 | 9/1985 | Yomoda et al. | 356/401 |
| 4,545,684 | 10/1985 | Kuroki et al. | 356/401 |

Primary Examiner—F. L. Evans
Assistant Examiner—Joel L. Harringa
Attorney, Agent, or Firm—Flehr, Hohbach, Test, Albritton & Herbert

[57] ABSTRACT

A method of aligning an object comprises the steps of providing a V-shaped mark which moves in correspondence with the position of the object, determining a position where this mark and a straight mark detection line crosses each other, and positioning this object on the basis of information on this determined position.

9 Claims, 23 Drawing Figures

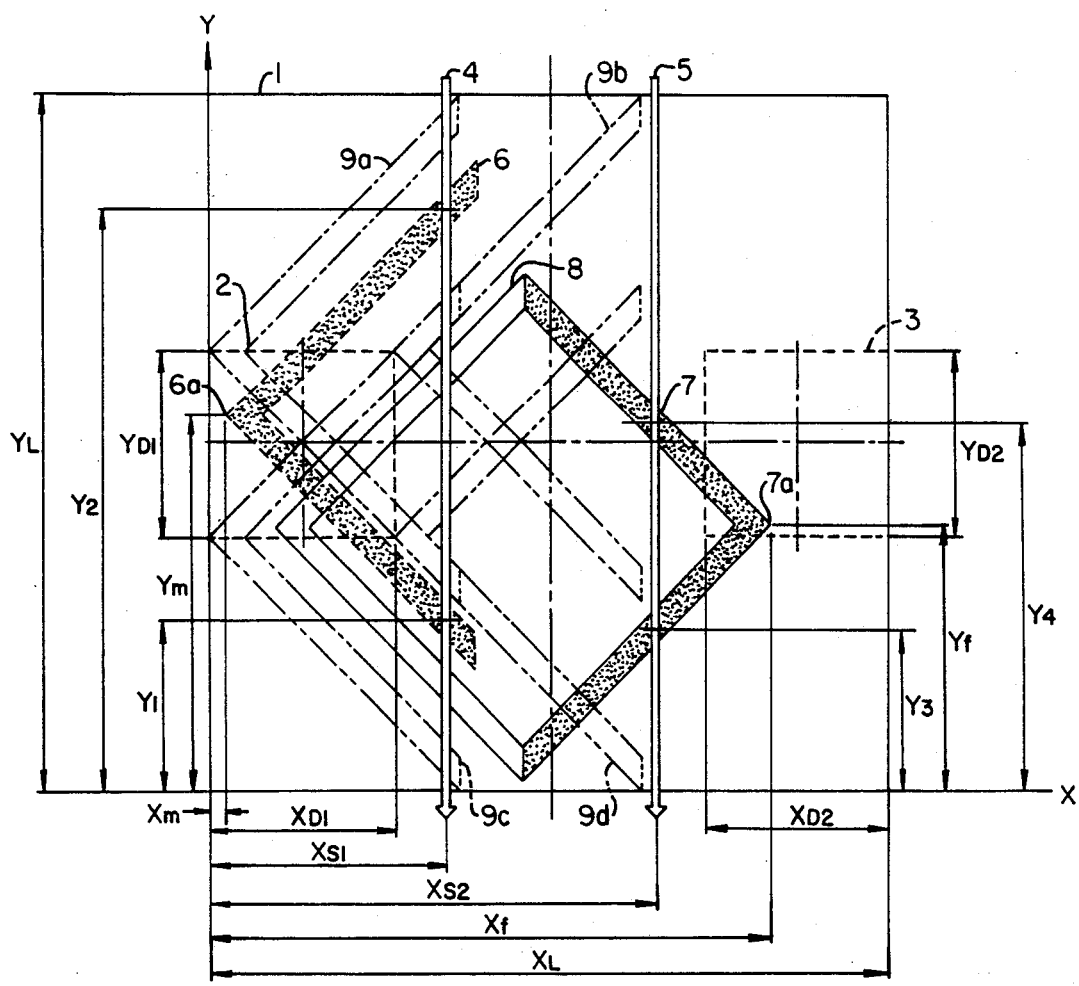
Fig._1.
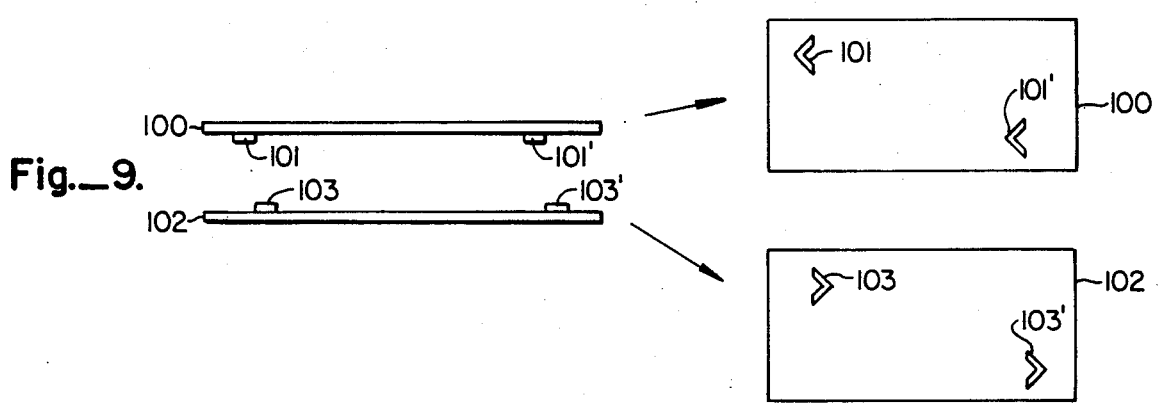
Fig._9.
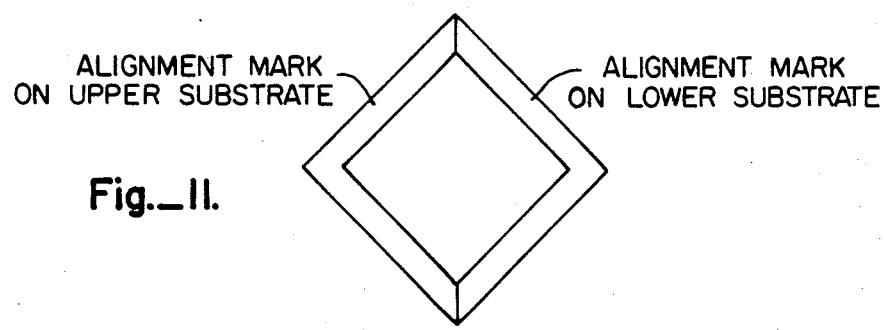
Fig._11.

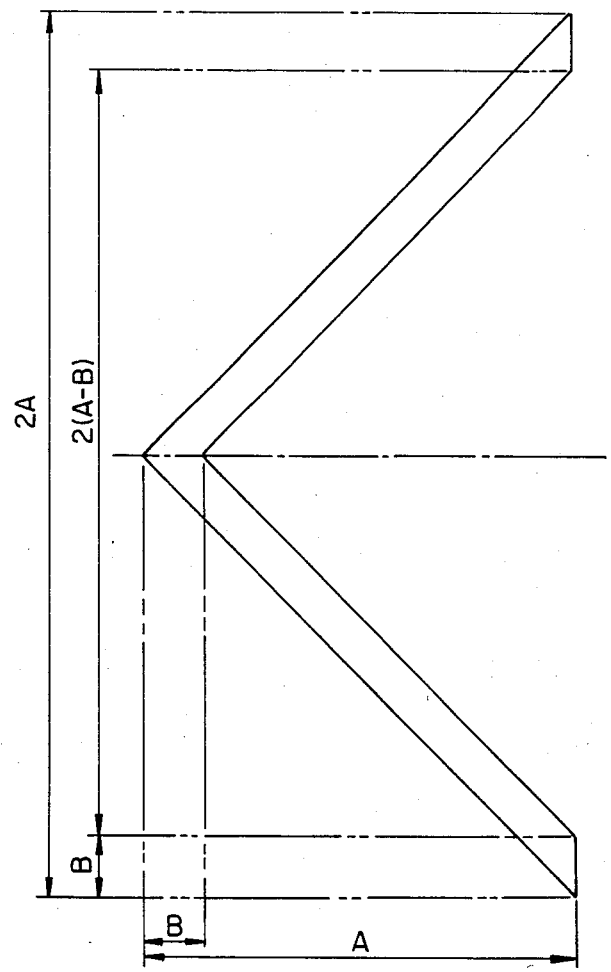
Fig._2.
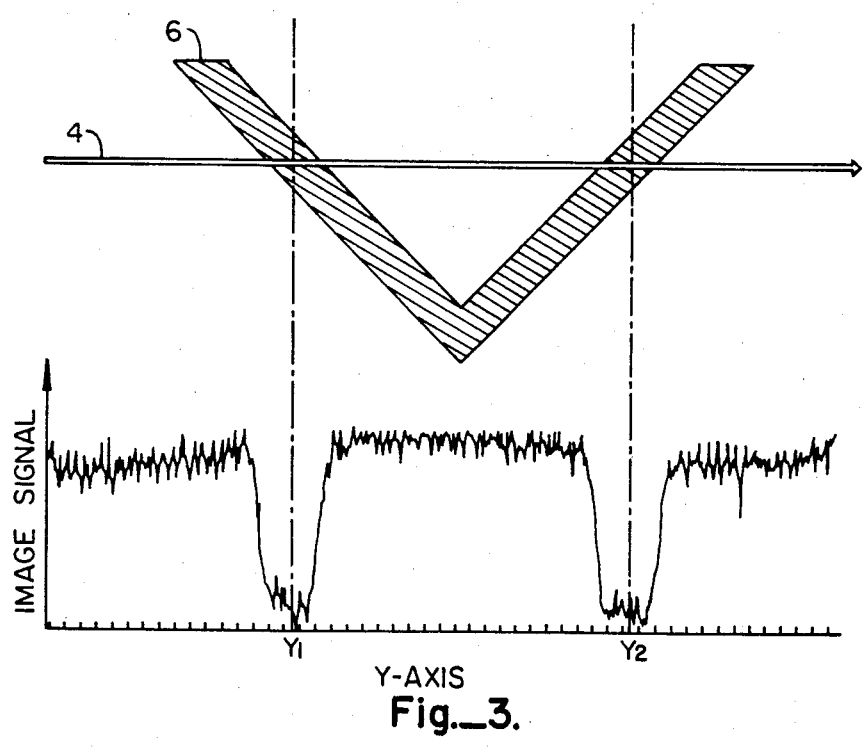
Fig._3.

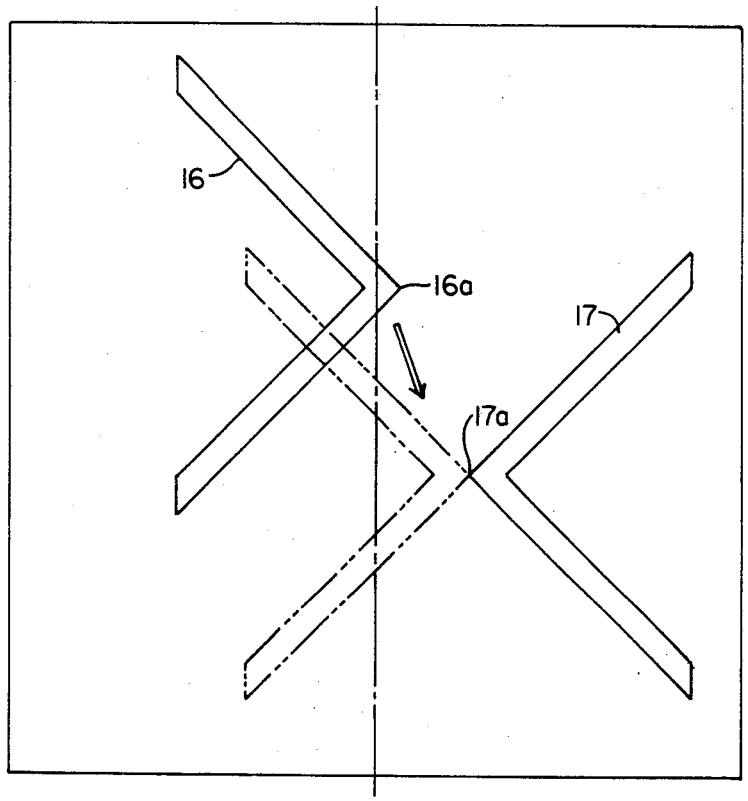
Fig._4.
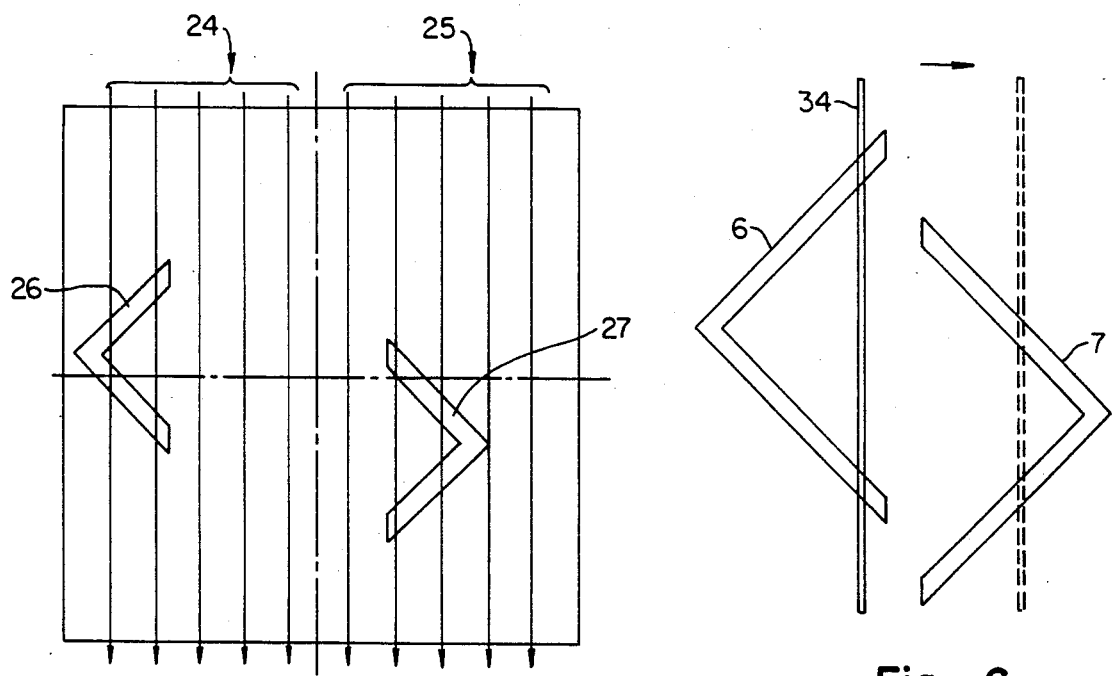
Fig._5.
Fig._6.

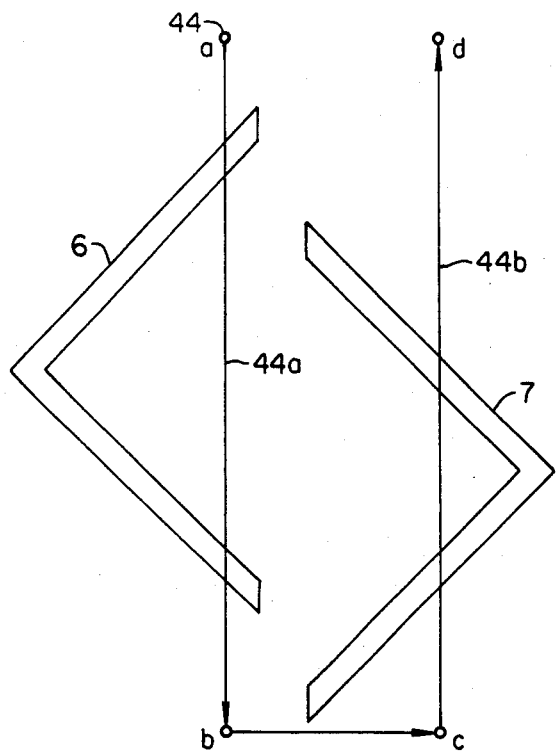
Fig._7.
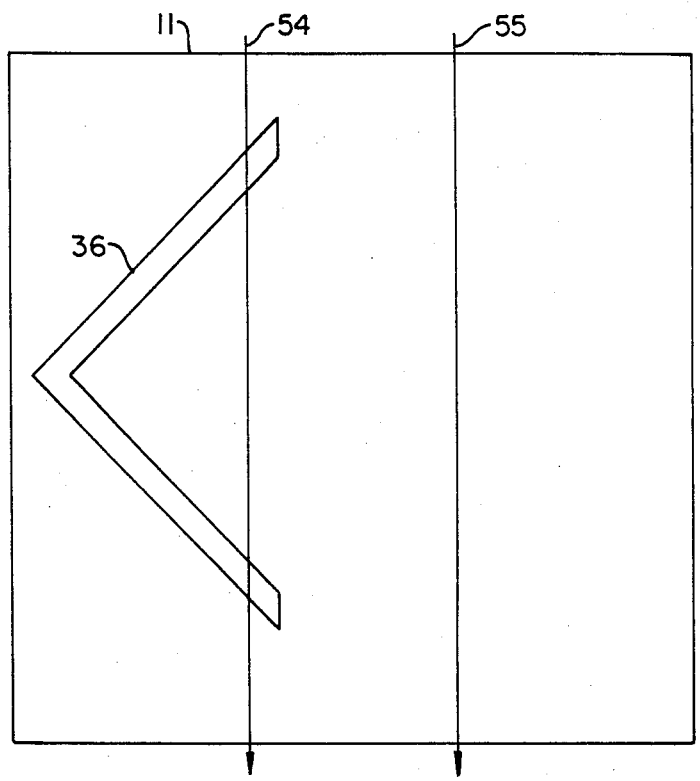
Fig._8.

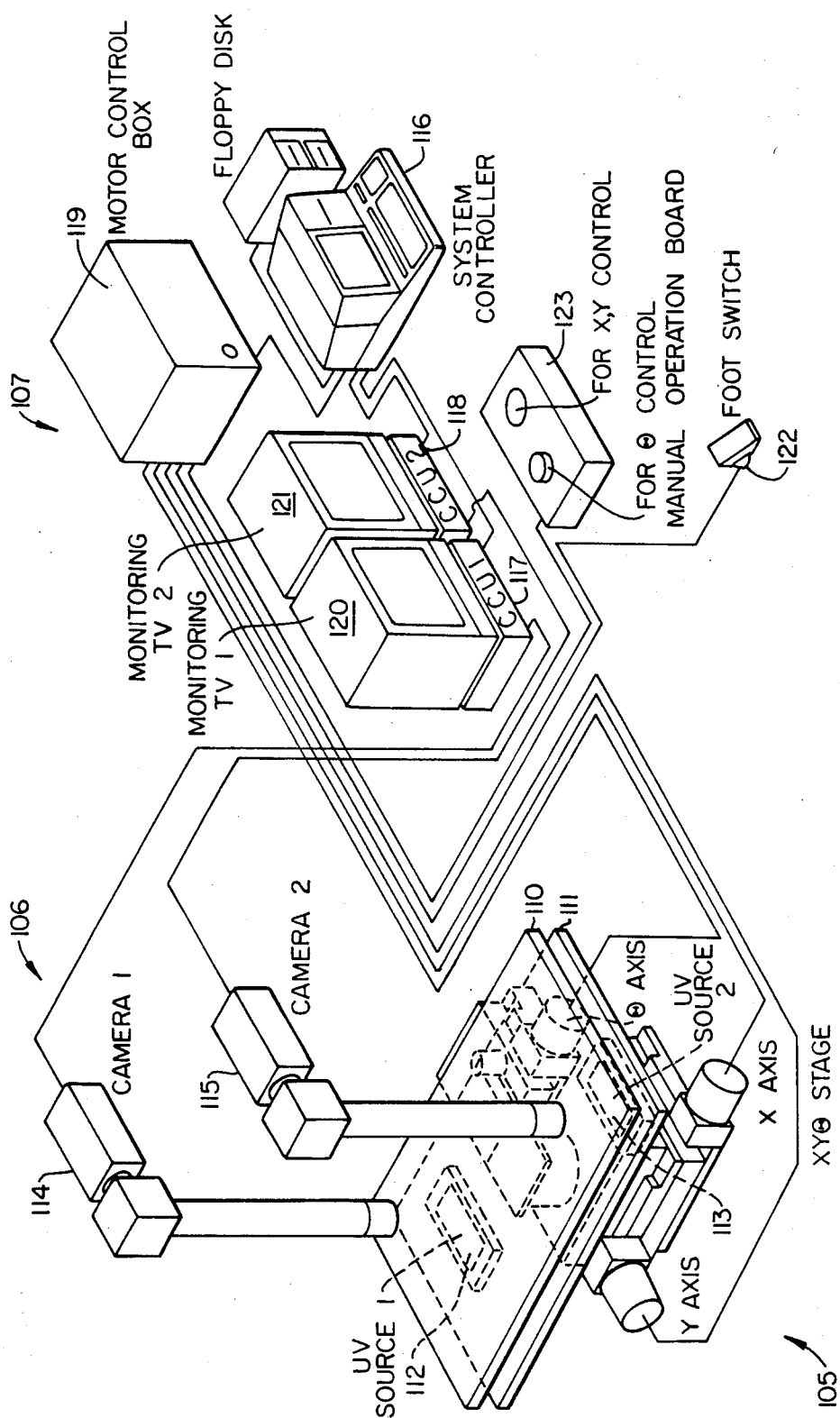
Fig.—10.

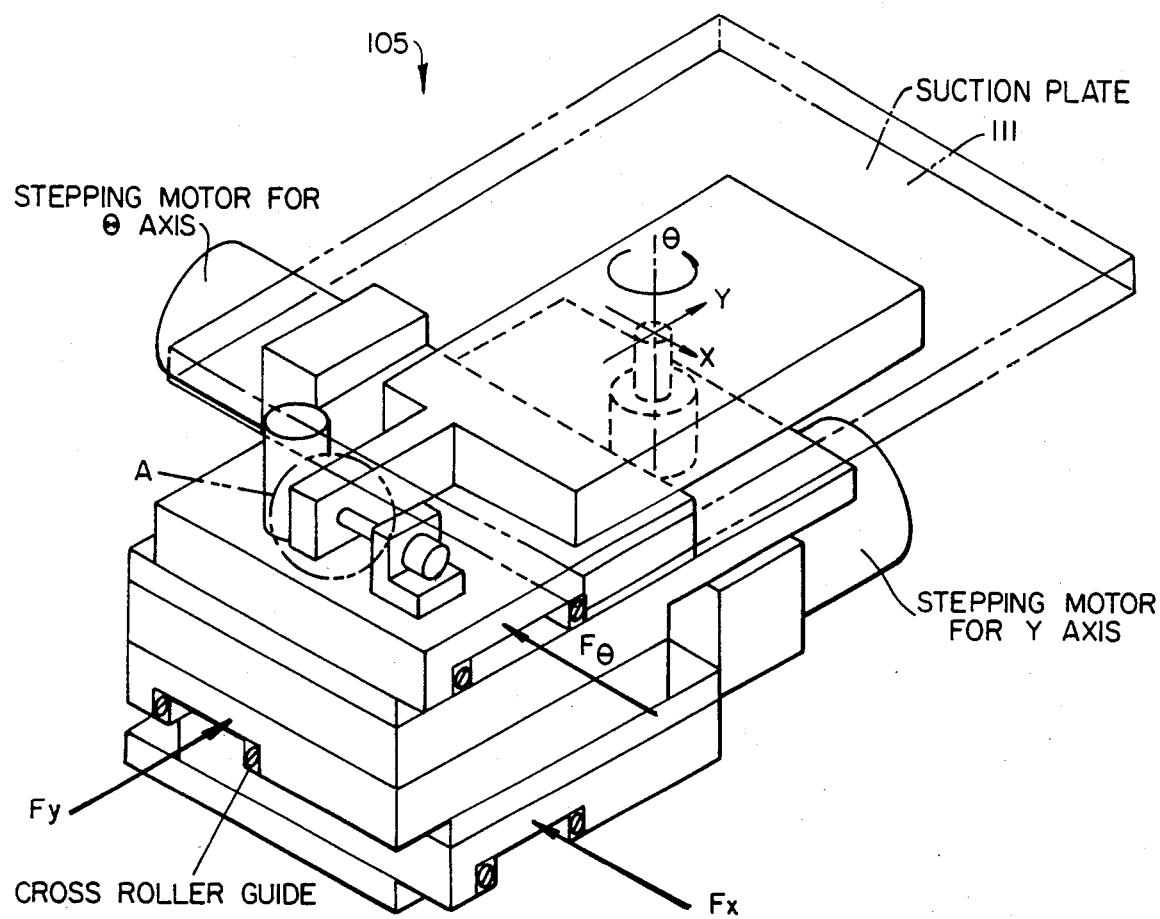
Fig._12.
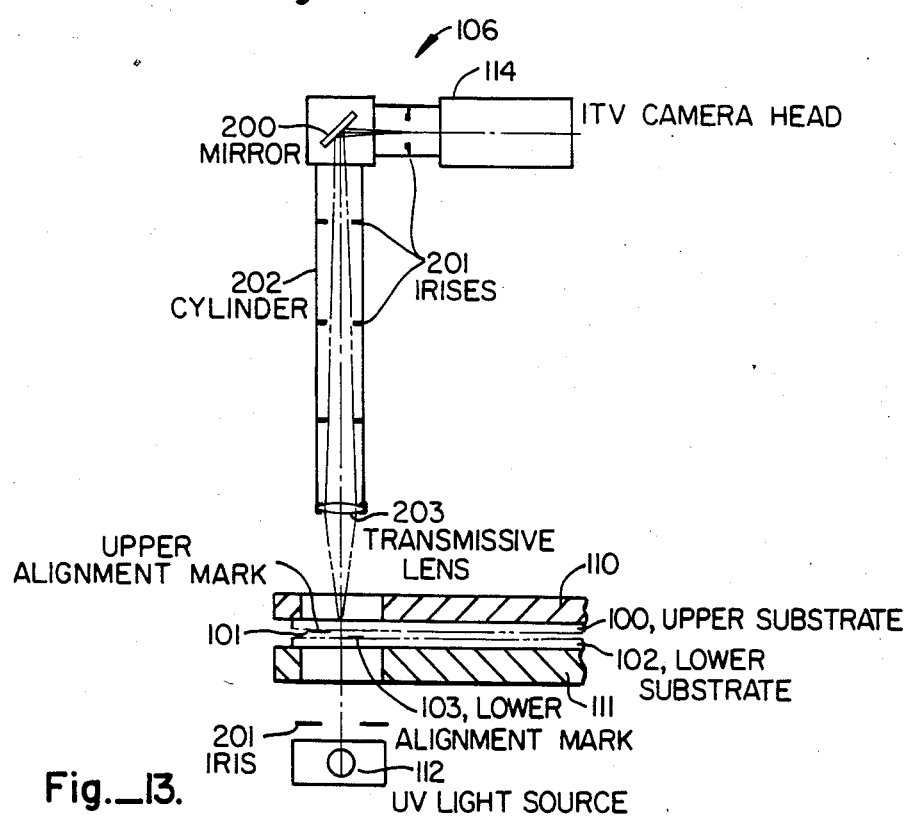
Fig._13.

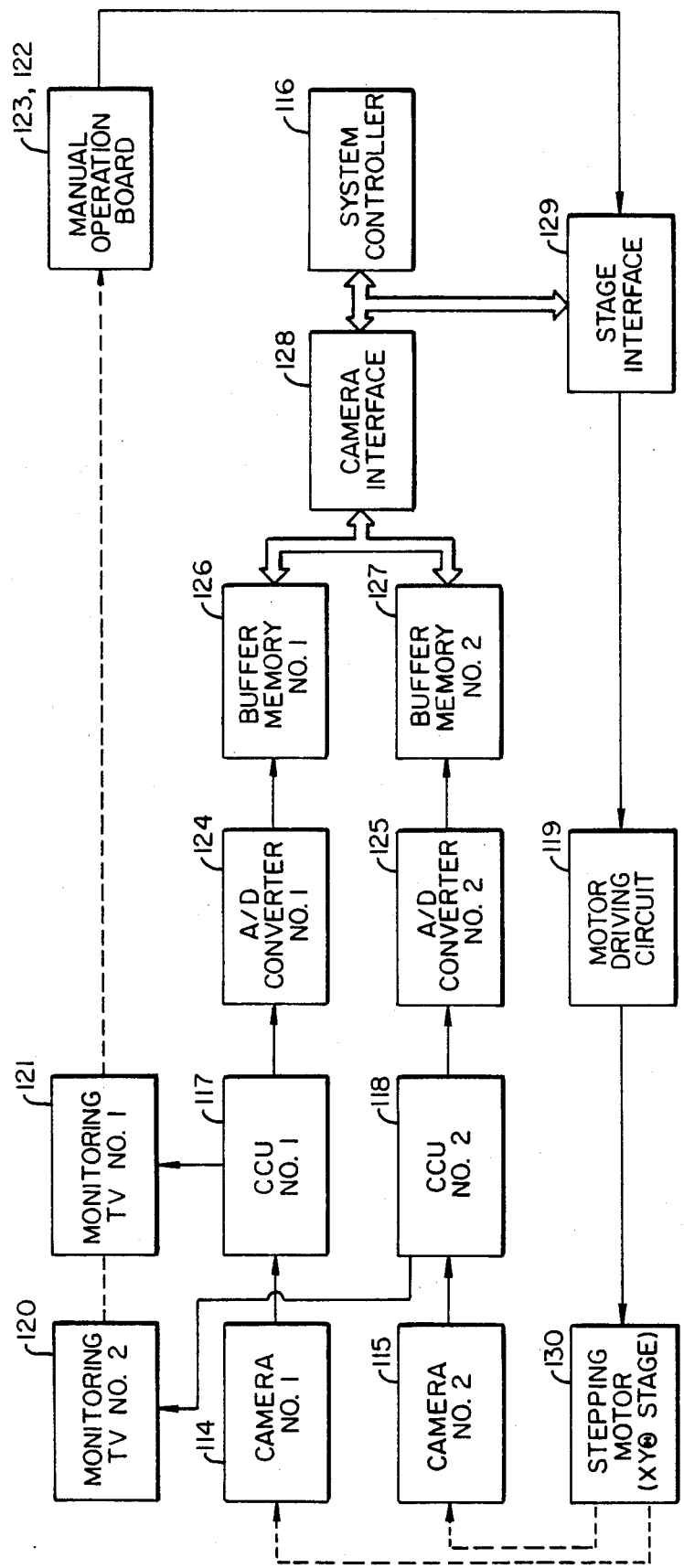
Fig._14.

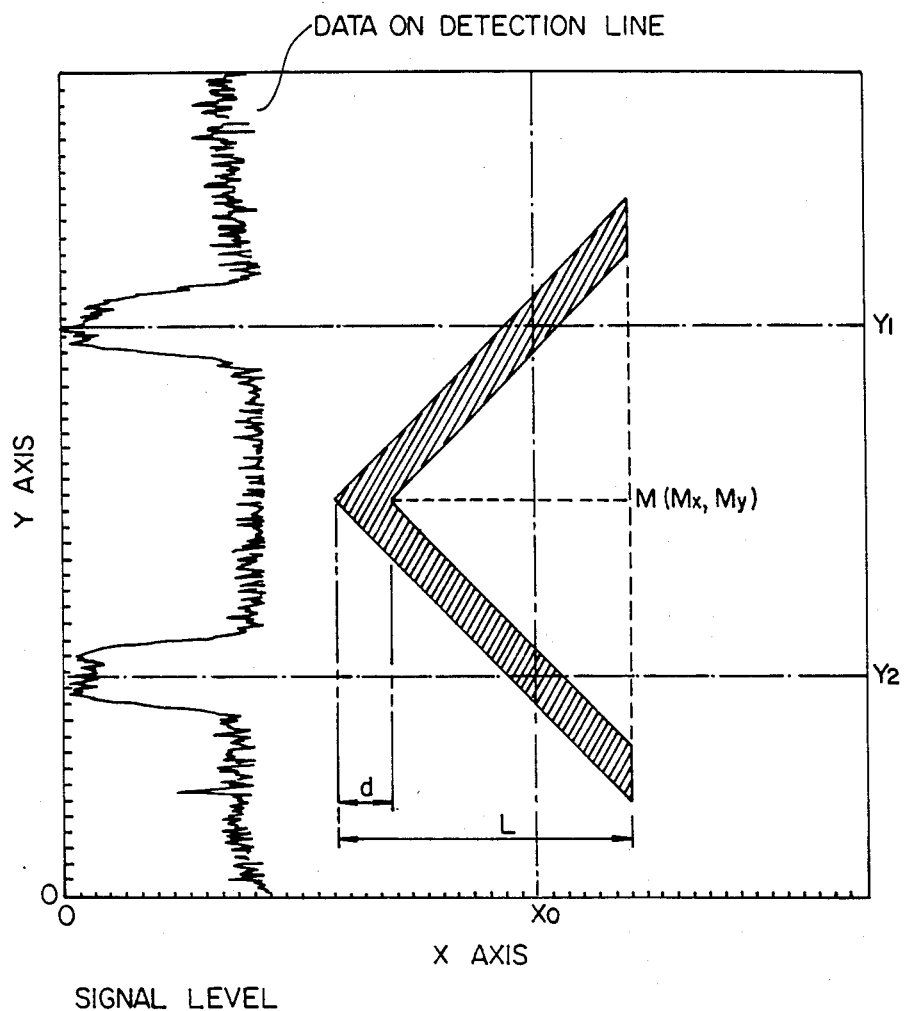
Fig.—15.

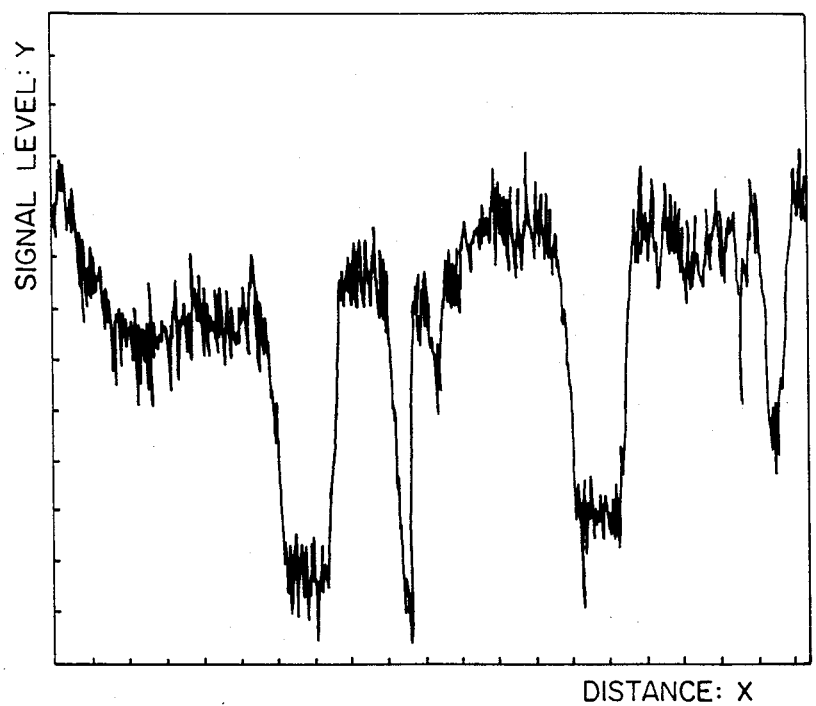
Fig.—16a.
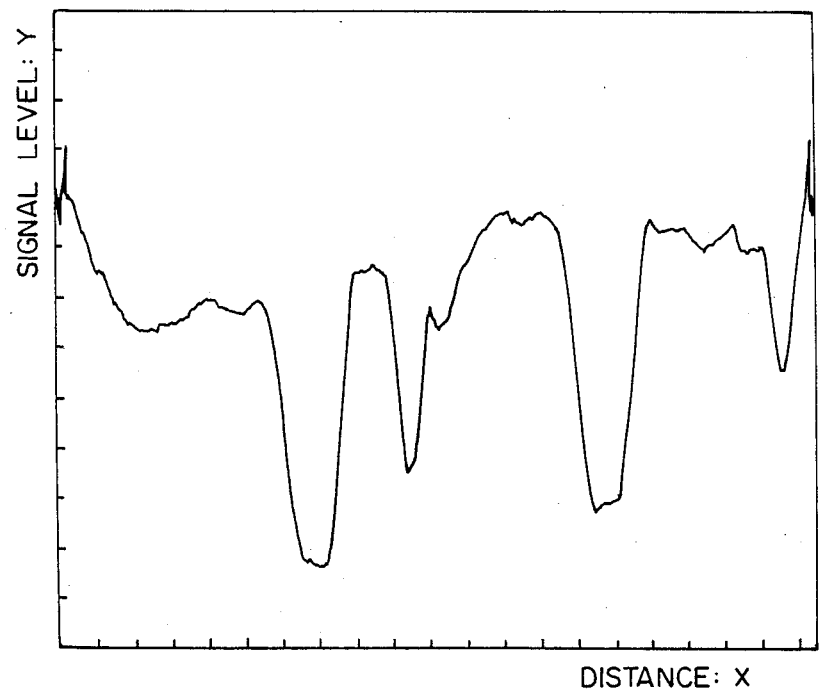
Fig.—16b.

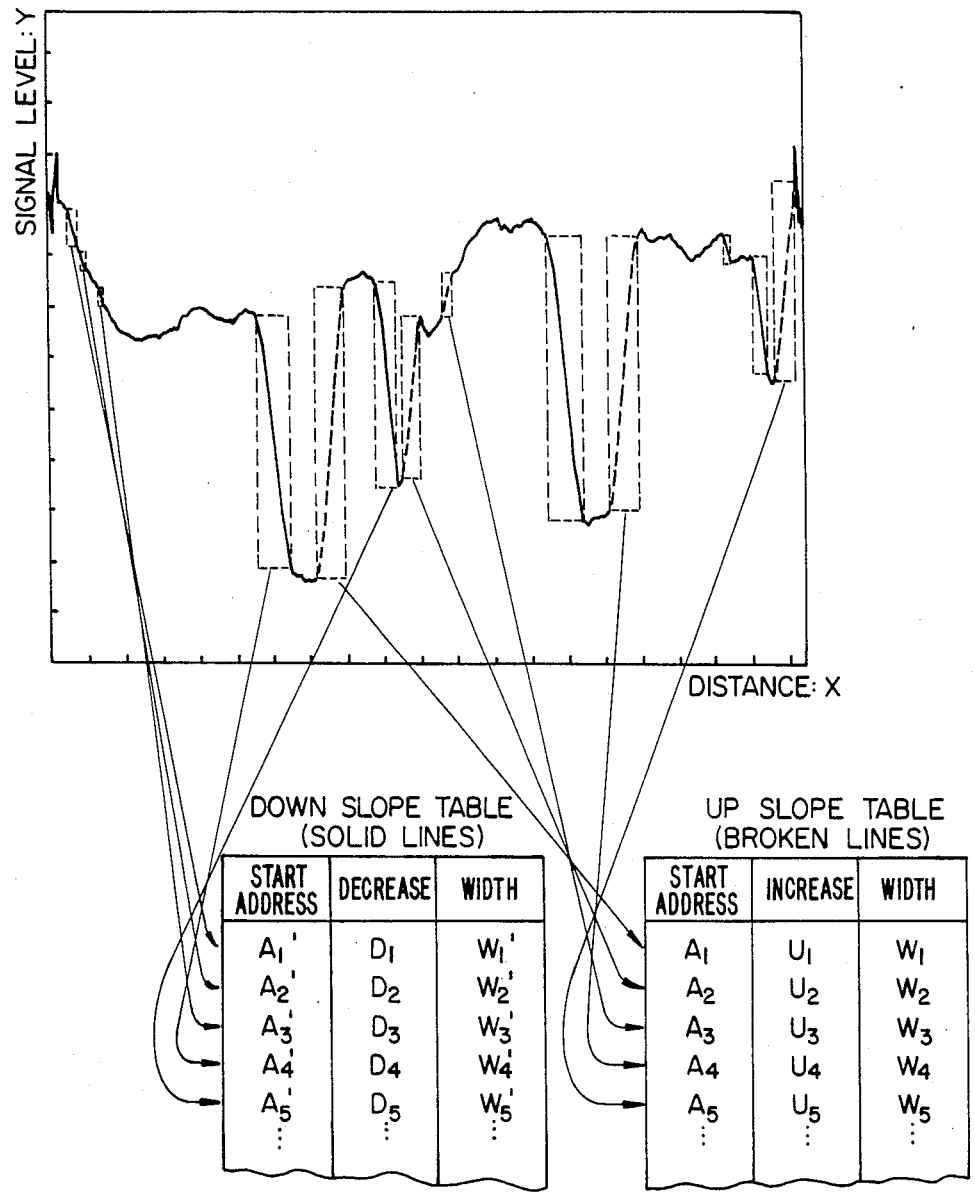
Fig.—16c.

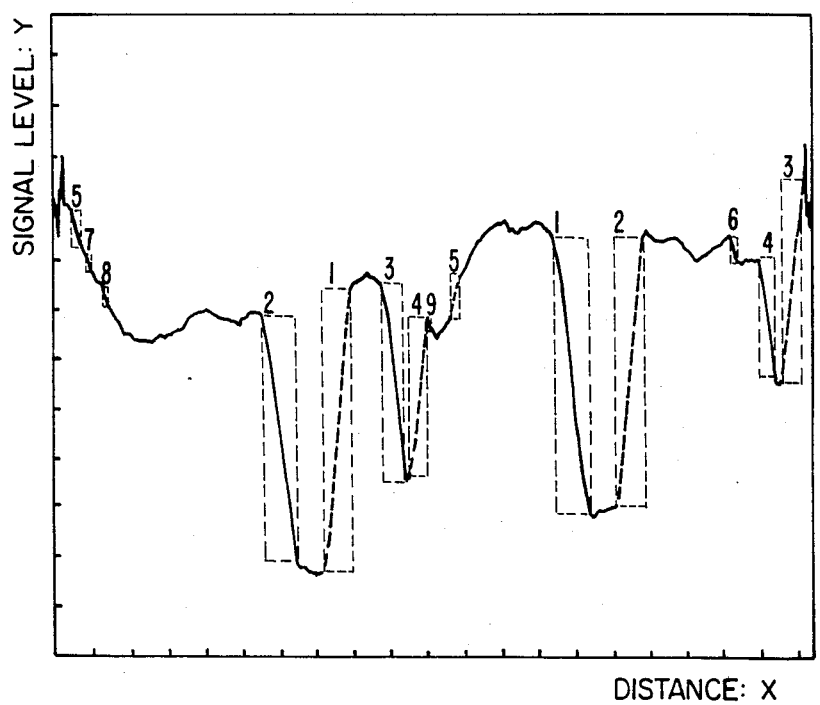
Fig.—16d.
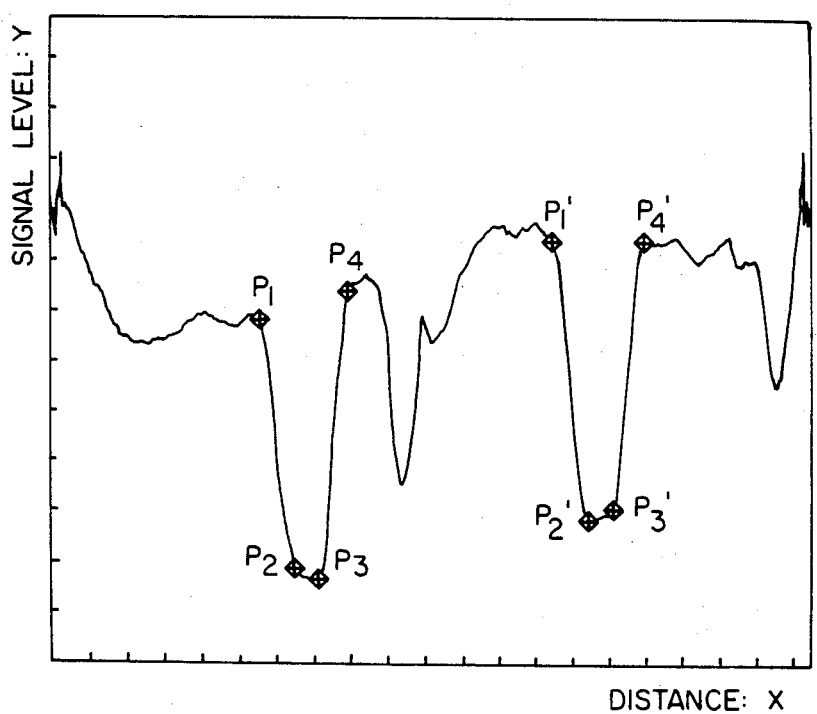
Fig.—16e.

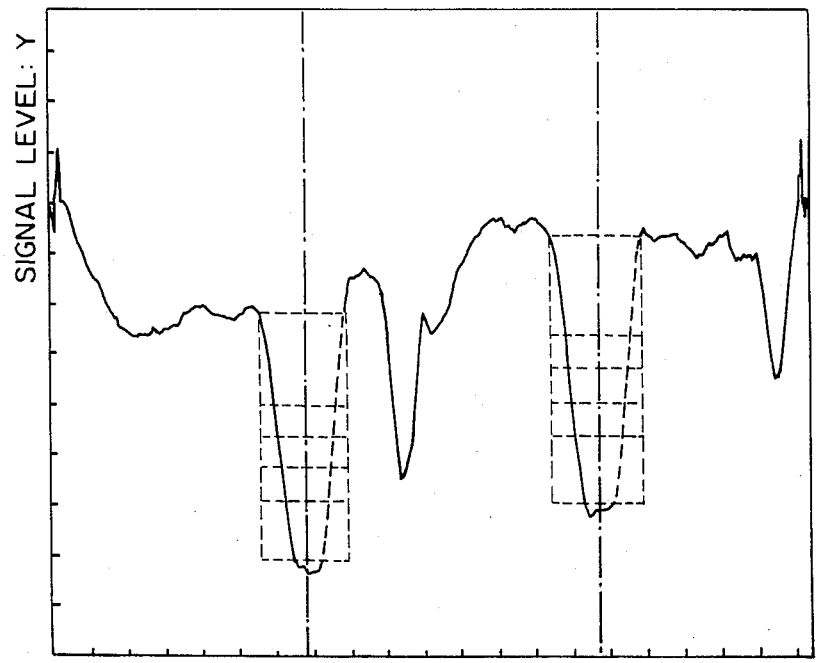
Fig._16f.
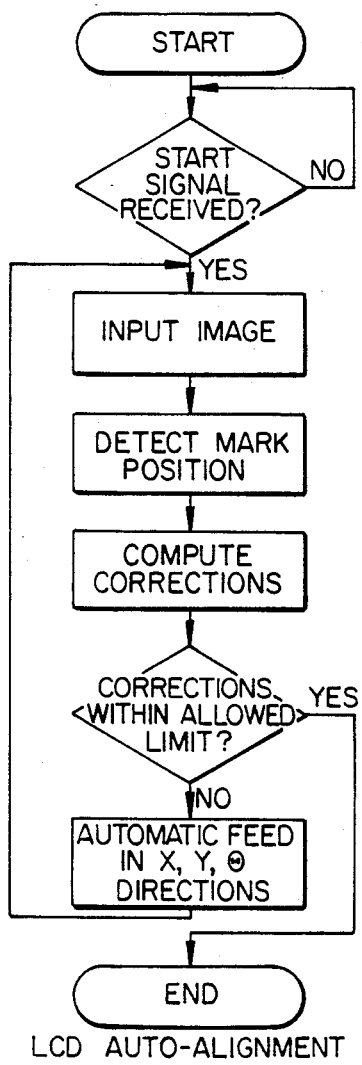
Fig._18.
LCD AUTO-ALIGNMENT

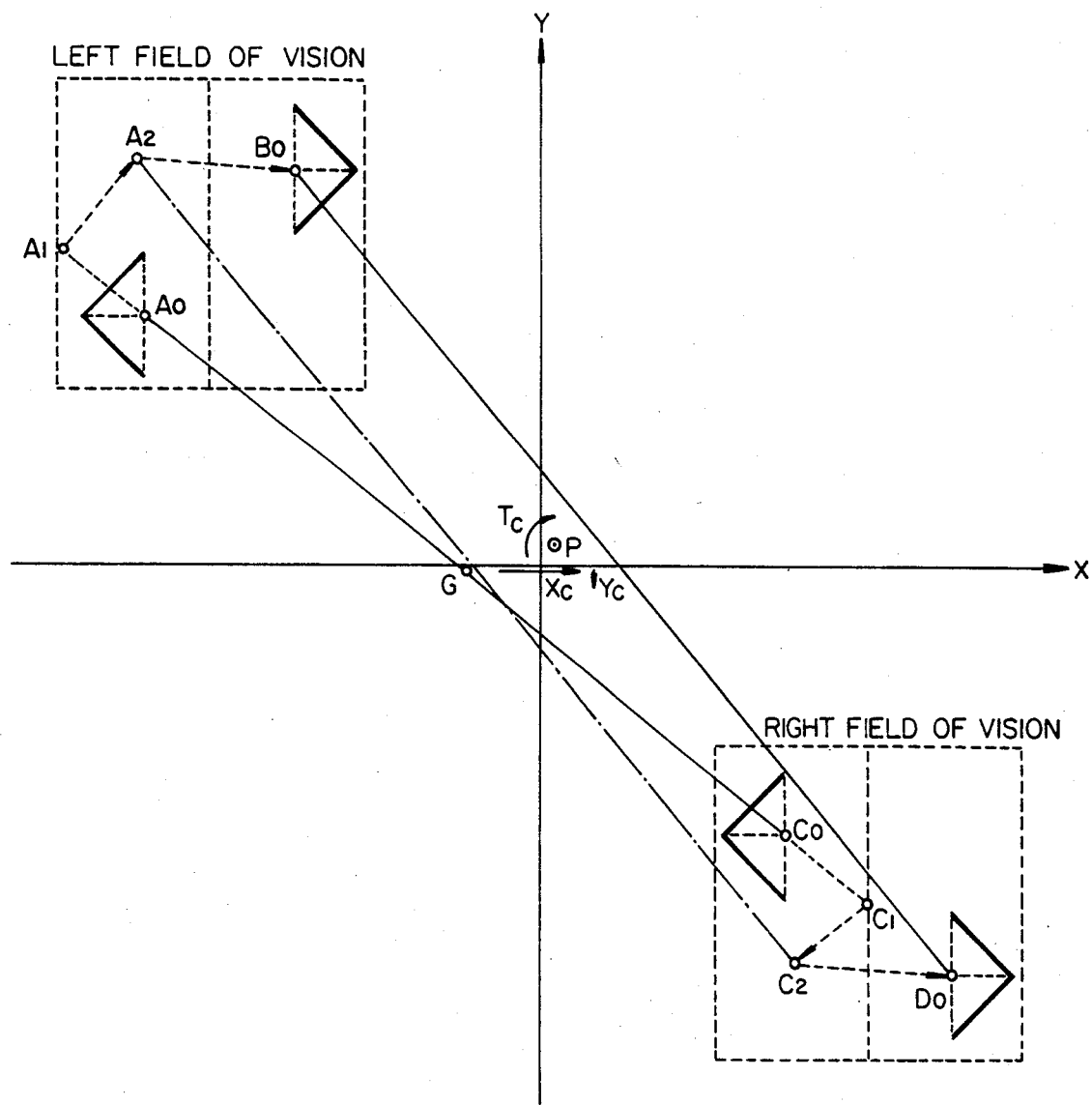
Fig._17.

ALIGNMENT METHOD

This invention relates to an alignment method for positioning an object by using an optical system to detect a mark on the object and processing the obtained image signals.

Alignment of two objects in a two-dimensional plane such as the positioning of semiconductor wafers in a manufacturing apparatus generally includes the steps of determining the positions of marks on a mobile object and a stationary object and adjusting the position of the mobile object on the basis of the positional relationship between these marks. Conventional alignment methods and systems used therefor, however, have various drawbacks. For example, the range within which the position of the mobile mark can be corrected is usually small compared to the size of the nearly square-shaped field of vision. When the marks on the objects approach too close to each other within the field of vision, detection may become difficult or even impossible because of the interference between the output waveforms of the image signals. Since the range within which the position of the mobile mark can be corrected shifts if the mark on the stationary object moves inside the field of vision, the method becomes inoperable if the mark on the stationary object cannot be set at a fixed position within the field of vision.

With the recent increase in the size of liquid crystal display devices as well as the density of semiconductor elements therein, technologies for accomplishing highly accurate positioning are becoming vitally important for the production of such display devices. The required level of accuracy cannot be attained by the conventional mechanical methods. Unautomated methods are necessarily unsatisfactory if only because of the introduction of dust particles when people are around. Even if skilled workers are employed, there still remains the problem of difference in characteristics among the individual workers.

It is therefore an object of the present invention in view of the situation described above to provide an alignment method which not only allows improved efficiency and increased speed in the processing but also contributes to the simplification of system hardwares.

Another object of the present invention is to provide an alignment method which allows highly accurate positioning of objects by using a V-shaped mark adapted to move in correspondence with the motion of an object and a position detection line for detecting the position of this V-shaped mark.

A further object of the present invention is to provide a method of accurately reading the instantaneous position of a V-shaped mark which moves in correspondence with the position of a mobile object so that this object can be accurately positioned.

Still another object of the present invention is to provide a method of accurately detecting the position of a V-shaped mark which moves in correspondence with the position of an object, without allowing the presence of dust particles and the like to adversely affect the accuracy of alignment.

A still further object of the present invention is to provide a method of speedily obtaining with a relatively few computational steps a pattern that is most closely resembling the pattern of the correct mark from a one-dimensional image signal containing narrow, pointed noise components and slowly varying background levels as the position information of a mark moving in correspondence with the position of an object.

Additional objects, advantages and novel features of the invention will be set forth in part in the description which follows, and in part will become apparent to those skilled in the art upon examination of the following or maybe learned by practice of the invention. It should be understood that the detailed description of and specific examples, while indicating preferred embodiments of the invention, are given by way of illustration only.

According to the method of the present invention, use is made of a V-shaped mark which moves in correspondence with the position of an object and a straight mark detection line. The position at which the aforementioned mark and the like cross each other is detected and the aforementioned object is positioned on the basis of this information on its position.

The present invention will be better understood from the detailed description given hereinbelow and the accompanying drawings which are given by way of illustration only, and thus are not limitative of the present invention.

FIG. 1 is a drawing for showing the principle of the method of the present invention.

FIG. 2 is a plan view of a mark.

FIG. 3 is a graph showing the relationship between an image signal and the position of a mark.

FIGS. 4 through 8 are drawings for showing the present invention according to other embodiments.

FIG. 9 is a drawing for showing the distribution of alignment marks on the upper and lower substrates when the present invention is applied to the positioning of the substrates of a large liquid crystal display device.

FIG. 10 is a perspective view schematically showing the composition of an alignment system embodying the present invention for the positioning of the upper and lower substrates of a liquid crystal display device.

FIG. 11 is a drawing which shows the situation where the alignment marks on the upper and lower substrates are accurately positioned.

FIG. 12 is a perspective view schematically showing the structure of an XY$\theta$ stage.

FIG. 13 is a side view schematically showing the structure of an optical unit for the alignment system of FIG. 10.

FIG. 14 is a block diagram of a control unit for the alignment system of FIG. 10.

FIG. 15 is a drawing for showing an alignment mark and image information obtained from a detection line.

FIGS. 16$a$–16$f$ are drawings which show procedures used in the method of the present invention for detecting from the image information from a detection line the center point of a valley indicating the position of an alignment mark.

FIG. 17 is a drawing for explaining the method of positioning alignment marks.

FIG. 18 is a flow chart for an alignment procedure.

In what follows, the present invention will be explained by way of one of its embodiments. As shown in FIG. 1, a V-shaped mobile mark 6 adapted to move in correspondence with the position of an object (not shown) and a stationary mark 7 are provided in a field of vision 1 with vertical length $Y_L$ and horizontal length $X_L$. Positioning of the object is effected by processing the image data of a mobile mark detection line 4 and a stationary mark detection line 5 to detect the positions of the marks and moving the mobile mark 6 to a position 8 so that the mobile mark 6 and the stationary mark 7 will form a square.

Initially, the mobile mark 6 and the stationary mark 7 are prealigned respectively on the left-hand side of the stationary mark detection line 5 and on the right-hand side of the mobile mark detection line 4. Thereafter, the positions of the mobile mark 6 and the stationary mark 7 are determined by processing the image signals of the mobile mark 6 on the mobile mark detection line 4 and the stationary mark 7 on the stationary mark detection line 5. In other words, only the image signals of the mobile mark 6 and the stationary mark 7 respectively on the mobile mark detection line 4 and the stationary mark detection line 5 are processed according to this embodiment. Since the amount of information to be processed is small, the system hardware need not be complicated and the processing can be completed quickly.

Reference being made to FIG. 1, the range within which the position of the mobile mark 6 can be detected is the area 2 of vertical length $Y_{D1}$ and horizontal length $X_{D1}$ within which the crest 6a of the mobile mark 6 must be found. The range 3 within which the position of the stationary mark 7 can be detected is similarly defined. When the crest 6a of the mobile mark 6 is inside the area 2, or when the mobile mark 6 is within the range surrounded by the corner positions 9a, 9b, 9c and 9d, the mobile mark 6 crosses the mobile mark detection line 4 at two points and the stationary mark detection line 5 does not cross the mobile mark 6.

FIG. 2 shows the shapes of the mobile mark 6 and the stationary mark 7. Each is V-shaped with height A and width 2A. The width is B both at the crest and the end positions.

Under the conditions described above, the method of detecting the positions of the marks according to the present invention will be explained next. By the position of a mark will be meant the position of its crest.

To start with, a density (shading gradation) signal on the mobile mark detection line 4 is inputted to the alignment system in order to detect the mobile mark 6 at its initial position. The relationship between the position of the mark and the density signal is illustrated in FIG. 3. The density signal is such that the signal level is lower at positions where the mobile mark density line 4 crosses the mobile mark 6. The Y coordinates $Y_1$ and $Y_2$ of the points at which the mobile mark detection line 4 crosses the mobile mark 6 are determined as the centers of the valleys in the signal.

If the X coordinate of the mobile mark detection line 4 is $X_{S1}$ as shown in FIG. 1, the position ($X_m$, $Y_m$) of the crest 6a of the mobile mark 6 is obtained geometrically as follows:

$$X_m = X_{S1} - (Y_2 - Y_1)/2 - B/2,$$

$$Y_m = (Y_2 + Y_1)/2.$$

Similarly, if the X coordinate of the stationary mark detection line 5 is $X_{S2}$ and the Y coordinates of the positions at which the stationary mark 7 and the stationary mark detection line 5 cross each other are $Y_3$ and $Y_4$ ($Y_4$ being greater than $Y_3$), the position of the crest 7a of the stationary mark 7 is given by $$X_f = X_{S2} + (Y_4 - Y_3)/2 + B/2,$$

$$Y_f = (Y_4 + Y_3)/2.$$

When the mobile mark 6 has been properly aligned with respect to the stationary mark 7 (or when the mobile mark 6 has been moved to the position 8 of FIG. 1), the position of its crest 6a is given by $$X_m' = X_f - 2A,$$

$$Y_m' = Y_f.$$

Thus, the correction to be made to the position of the mobile mark 6 along the X and Y axes is given by $$\Delta X_m = X_m' - X_m$$

$$= X_{S2} - X_{S1} + (Y_4 - Y_3 + Y_2 - Y_1)/2 + B - 2A,$$

$$\Delta Y_m = Y_m' - Y_m$$

$$= (Y_4 + Y_3 - Y_2 - Y_1)/2.$$

In other words, the mobile mark 6 reaches the position 8 to form a square with the stationary mark 7, thus completing the alignment, if it is moved by $\Delta X_m$ along the X axis and by $\Delta Y_m$ along the Y axis.

FIGS. 4 through 8 show other embodiments of the present invention. According to the embodiment of FIG. 4, alignment is effected by matching the positions of the crests 16a and 17a of a mobile mark 16 and a stationary mark 17. According to the embodiment of FIG. 5, mobile and stationary marks 26 and 27 are made smaller and use is made of a plurality of mark detection lines 24 and 25 so that the area in which the marks can be detected is larger. According to the embodiment of FIG. 6, use is made of a mark detection line 34 composed of a single one-dimensional charge coupled device (CCD) or the like which can be shared for detection of both marks 6 and 7. According to the embodiment of FIG. 7, a point sensor 44 is used to scan a mark detection line 44a between positions a and b to detect the mobile mark 6 and another mark detection line 44b between positions c and d to detect the stationary mark 7. According to the embodiment of FIG. 8, only one mark 36 is provided in the field of vision 11 and the position of an object carrying the mark 36 is detected by either one of the two mark detection lines.

In summary, the present invention makes it possible to detect two-dimensional mark positions by processing image data on one-dimensional mark detection lines. The amount of data to be processed is therefore reduced and the time required for the processing is shortened. Memory devices for storing image data need not be large and high-speed analog-to-digital converters are unnecessary. Thus, the system hardwares can be simplified according to the present invention. Moreover, the present invention makes it possible to make effective use of a square or nearly square field of vision to provide a large detection range. The detection process can be simplified by separating the domains for the mobile mark 6 and the stationary mark 7 inside the field of vision. Interference between the output signals can also be eliminated by the present invention when the marks are close to each other. Since the detection range for the mobile mark is determined independently of the position of the stationary mark, furthermore, the present invention may be applied to situations where the prealignment accuracy for the marks is controlled by the position of the stationary mark.

Next, applications of the present invention to large scale liquid crystal display devices are explained. A liquid crystal display device generally includes a liquid crystal layer sandwiched between two substrates which must be aligned very accurately with respect to each other so that the electrodes provided individually thereon can be correctly positioned. Accordingly, it is the primary object of this embodiment to effect high-precision positioning of substrates by the aligning method of the present invention. Let us assume that the liquid crystal display device considered for this embodiment includes transparent glass substrates such as substrates made of soda glass and that the electrodes formed thereon are made of transparent ITO films formed by vapor deposition. Let us further assume that the V-shaped marks to be used for the alignment of substrates are also formed by ITO films and that the relative positions of the electrodes and the alignment marks on the substrates are accurately maintained. FIG. 9 shows the positioning of V-shaped alignment marks on the substrates of a liquid crystal display device.

There are two V-shaped alignment marks 101 and 101' at diagonally separated positions on the upper substrate 101. The lower substrate 102 is also provided with V-shaped alignment marks 103 and 103' diagonally separated from each other and corresponding to the alignment marks 101 and 101' on the upper substrate. These V-shaped alignment marks 101, 101', 103 and 103' are shaped as shown in FIG. 2 and arranged so that the marks 101 and 103 and the marks 101' and 103' will form squares if the substrates 100 and 102 are correctly positioned.

According to this embodiment, the upper substrate 100 is kept stationary and the lower substrate 102 is mobile. The positions of the four V-shaped alignment marks 101, 101', 103 and 103' are derived from the image information for the crossing points between a straight detection line and the marks and the mobile lower substrate 102 is adjustably moved in the X, Y and $\theta$ directions so that the marks 101, 101', 103 and 103' will form squares as described above.

In order to accurately read the positions of the four alignment marks, the image information within the field of vision is taken into a memory means. In order to obtain image information, contrasty images must be obtained. For this purpose, the marks 101, 101', 103 and 103' may preferably be irradiated by a light beam such as an ultraviolet beam so that the position images of the marks can be obtained by detecting the intensity variations of the beam. By the image information is meant here the information on a mark detection line as explained in connection with an earlier embodiment.

FIG. 10 is a drawing for showing the structure of an alignment system for the positioning of upper and lower substrates of a liquid crystal display device. The hardwares for this system may be divided roughly into the following three groups: an XY$\theta$ stage, optical units and a control unit.

The upper substrate 100 is adapted to become secured on a stationary substrate suction plate 110. The lower substrate 102 is adapted to become secured to a mobile substrate suction plate 111 so as to be able to move in the X, Y and $\theta$ directions. Irradiating light sources 112 and 113 such as ultraviolet sources are provided below the stationary substrate suction plate 111 corresponding to the positions of the first group of the alignment marks 101 and 103 and the second group of the alignment marks 101' and 103'0 formed in diagonally separated relationships on the upper and lower substrates 101 and 102 as described above.

Light beams such as ultraviolet beams from the sources 112 and 113 are made incident into the fields of vision for the first and second groups of alignment marks, respectively, and the beams passing through the upper and lower substrates 100 and 102 are received by cameras 114 and 115. The intensity variations of the beams on the mark detection lines individually provided inside the field of vision of these groups are accepted as the image information of the alignment marks and the positions of the individual alignment marks are obtained from this information. This process is performed by a system controller 116 and camera control circuits 117 and 118. The source 112, the camera 114 and the camera control circuit 117 are adapted to be operated for detecting the positions of the alignment marks 101 and 103 belonging to the first group, and the source 113, the camera 115 and the camera control circuit 118 are adapted to be operated for detecting the positions of the alignment marks 101' and 103' belonging to the second group.

If the image information on the positions of the alignment marks indicates that the two alignment marks of each group are not forming squares correctly, the positions of the stationary and mobile alignment marks of each group are compared and the magnitudes of necessary corrections are obtained. The mobile alignment mark is moved by this amount by moving the mobile substrate in the X, Y and $\theta$ directions. The system controller 116 and the camera control circuits 117 and 118 are used to obtain the magnitudes of corrections for the alignment marks. Among the methods for moving the mobile substrates are the method of giving the magnitudes of corrections directly from the system controller 116 to a motor control box 119 to drive the XY$\theta$ stage to move the mobile substrate suction plate 111 and the method of displaying the images of the alignment marks of the first and second groups in the field of vision by monitoring TV sets 120 and 121 so that the operator can use a foot switch 122 and a manual operation table 123 while watching the images to drive the XY$\theta$ stage by providing control information to the motor control box 119. When the mobile alignment marks are correctly moved, squares as shown in FIG. 11 are formed by the alignment marks of the first and second groups. The alignment marks of each group are displayed on the monitoring TV sets 120 and 121 by means of the camera 114 and 115.

FIG. 12 show the structure of the XY$\theta$ stage 105. The stage comprises an X axis, a Y axis and a $\theta$ axis which are piled up in this order from the bottom side and is adapted to move the mobile substrate suction plate 111 in the directions of these axes. The X and Y axes drive a cross roller guide table through a decelerator and ball screws by means of a stepping motor. As for the $\theta$ axis, since extremely fine controls must be effected, the same cross roller guide table is used to drive the outer peripheral part of the $\theta$ stage (shown by A in FIG. 12). Each axis is provided with a load (shown by $F_X$, $F_Y$ and $F_\theta$ in FIG. 12) in the direction of the axis to control the backlash effects. The driving in the X, Y and $\theta$ directions is effected by commands from the motor control box 119.

As explained above, there is a total of four alignment marks 101, 101', 103 and 103' on the two substrates and there are two optical units each adapted for observation of a pair of alignment marks (such as 101 and 103, and 101' and 103'), one on the upper substrate and the other on the lower substrate. FIG. 13 shows one of these optical units designed for use in the ultraviolet region.

Reference being made to FIG. 13, the optical unit 117 for the alignment marks 101 and 103 of the first group comprises an iris 201 between the ultraviolet light source 112 and the substrates 100 and 102 in order to improve the image resolution and to eliminate the effects of aberrations of the objective lens and interference effects of the source light. The aforementioned iris 201 is provided because the image resolution is generally influenced by the interference effects of the source and the interference effects are influenced by the source opening.

An ITV camera with a high resolution is preferably used for receiving the images. The optical unit 117 has magnification 10 and resolution of 1 μm per scanning line. Image distortions caused by the camera head 114 are corrected by using a distortion correction circuit. FIG. 12 also shows a mirror 200 with an aluminum surface, a cylinder 202 provided with irises 201 and a transmissive lens 203. An ultraviolet beam from the source 112 is made incident on the alignment marks 101 and 103 and the light intensity on the detection lines crossing these alignment marks is detected to determine the positions of the marks. If they are not forming a square as shown in FIG. 11, corrections are effected by moving the mobile substrate in the X, Y and $\theta$ directions.

FIG. 14 is a block diagram of the control unit. The control unit is adapted to use the ITV cameras as sensors and to provide the position feedback to a motor driving circuit. The image signals of alignment marks on the detection lines from the cameras 114 and 115 are provided respectively to the camera control units (CCU) 117 and 118. The image signals are amplified and corrected by these camera control units 117 and 118 and stored respectively in buffer memories 126 and 127 after undergoing analog-to-digital conversion. Numerals 125 and 125 indicate analog-to-digital converters for this purpose. The system controller 116 extracts data from these buffer memories 126 and 127 and determines the positions of the respective alignment marks through signal processing. This is done with respect to the two groups of alignment marks by using two cameras 114 and 115. The motion of each axis of the XY$\theta$ stage is calculated and a pulse corresponding to this calculated result is provided to the motor driving circuit 119. The motor driving circuit 119 drives a stepping motor and corrects the position of the mobile substrate.

The operator may alternatively carry out the alignment manually by operating the manual operating boards 122 and 123 inclusive of a foot switch while watching the monitoring TV screens 120 and 121. The camera control units 117 and 118 control the camera heads and carry out analog processing of image signals, etc.

According to this embodiment of the present invention, use is made of partial image information on one detection line corresponding to one alignment mark and the X and Y coordinates of two alignment marks are efficiently determined. As will be explained more in detail below, the present invention makes it possible not only to detect errors due to overall variations in the signal levels and background variations but also to accurately determine the positions of alignment marks even in the presence of dirt and dust particles.

FIG. 15 illustrates another embodiment of the present invention wherein the position of an alignment mark is not considered to be at the crest but at the point M($M_X$, $M_Y$) shown in the figure. According to this embodiment, therefore, the substrates are considered accurately positioned when the positions of the two alignment marks belonging to the same group coincide with each other.

The position M($M_X$, $M_Y$) of the alignment mark of FIG. 15 may be expressed as follows in terms of the position $X_0$ of the detection line and the positions $Y_1$ and $Y_2$ (where $Y_1$ is greater than $Y_2$) of the two valleys found in the signal representing the shading gradation on the detection line;

$$M_X = X_0 - (Y_1 - Y_2)/2 + L - d/2,$$

$$M_Y = (Y_1 - Y_2)/2$$

where L and d are as defined in FIG. 15. A procedure for accurately determining $Y_1$ and $Y_2$ from the data on the detection line will be explained below.

Firstly, the signals on the detection lines are extracted from the image information in the fields of vision obtained by the cameras 114 and 115 and stored in the image buffer memories 126 and 127. The signal waveform in FIG. 16a shows that the signal level drops where the detection line intersects the alignment marks 101, 101', 103 and 103', indicating that the ultraviolet light intensity is weak at these places. Since the signal level may drop elsewhere, too, due to noise, etc., however, it is necessary to accurately calculate the valley positions in order to determine the position M of a reshaped alignment mark. FIG. 16b shows a smoothed signal obtained by using an appropriate space operator when the original signal contains random high-frequency components. FIG. 16c shows the step of identifying continuously rising or dropping parts from the smoothed signal components. Only patterns with a minimum width are considered because the memory size is limited. The identified parts are numbered as shown in FIG. 16d in the order of how closely the pattern resembles the shape of an alignment mark. In the next step (FIG. 16e), numbers are assigned to the starting and end points of the rising and dropping parts of each valley pattern which resembles that of an alignment mark. The center position of the valley is obtained from the symmetry of the valley shape as shown in FIG. 16f.

The method of calculating the distance by which the position of an alignment mark must be corrected is explained next. Let us assume that the positions $A_0$($A_{0X}$, $A_{0Y}$) and $C_0$($C_{0X}$, $C_{0Y}$) of the two alignment marks on the mobile substrate and the positions $B_0$($B_{0X}$, $B_{0Y}$) and $D_0$($D_{0X}$, $D_{0Y}$) of the two alignment marks on the stationary substrate have been identified as shown in FIG. 17 in the respective fields of vision for the marks of the first and second groups. Let us now define the midpoint G($G_X$, $G_Y$) between $A_0$ and $C_0$ such that $$G_X = (A_{0X} + C_{0X})/2,$$

$$G_Y = (A_{0Y} + C_{0Y})/2.$$

If the separation between the two alignment marks is different between the two substrates, this error will be evenly distributed between the two substrates. For this purpose, the line segment $A_0C_0$ (of length $L_1$) is elongated or shortened along the same direction so that a new line segment $A_1C_1$ of length $L_2$ equal to that of the line segment $B_0D_0$ is obtained. The X and Y coordinates of the point $A_1$ thus defined are given respectively by $$A_{1X} = G_X + (A_{0X} - G_X)L_2/L_1,$$

$$A_{1Y} = G_Y + (A_{0Y} - G_Y)L_2/L_1.$$

Next, the line segment $A_1C_1$ is rotated so that it will become parallel to the line segment $B_0D_0$. The angle (in radian) by which the rotation must be effected is given by $$T_C = \tan^{-1}[(B_{0Y} - D_{0Y})/(B_{0X} - D_{0X})] - \tan^{-1}[(A_{0Y} - C_{0Y})/(A_{0X} - C_{0X})].$$

If the rotation is effected around point $P(P_X P_Y)$, the point $A_1$ will move to a new position $A_2$ of which the X and Y coordinates are given by $$A_{2X} = \cos T_C(A_{1X} - P_X) - \sin T_C(A_{1Y} - P_Y) + P_X,$$

$$A_{2Y} = \sin T_C(A_{1X} - P_X) + \cos T_C(A_{1Y} - P_Y) + P_Y.$$

Thus, the correction distances $X_C$ and $Y_C$ along the X and Y directions are $$X_C = B_{0X} - A_{2X},$$

$$Y_C = B_{0Y} - A_{2Y}.$$

FIG. 18 is a flow chart for the alignment procedure of this invention. According to this procedure, corrections are repeated several times until it is ascertained that the correction distances have converged to less than a predetermined level. Such repetitions are for counteracting the effects of misalignment of the coordinate systems in the fields of vision, the axes of the XYθ stage, etc.

Among the common factors contributing to the reliability of alignment systems are electrical noise in the image input signal, changes in the characteristics of the illumination system with time, presence of dust, etc. These factors are carefully considered and the present invention provides a reliable method of detecting the positions of marks substantially independently of the presence of dust particles, etc.

For a situation where the one-dimensional image signal on a mark detection line contains narrow and sharply pointed noise components or a gradually varying background level as shown in FIG. 16a, a method for quickly and efficiently detecting a pattern that resembles a known pattern corresponding to an alignment mark will be explained next more in detail. Use will be made in this case of the cameras 114 and 115 for inputting image signals, the analog-to-digital converters 124 and 125 for quantizing the one-dimensional image information on the detection lines from the inputted image signals and performing analog-to-digital conversions, the image memory units 126 and 127 for storing the analog-to-digital converted information, and a detector-processor means for detecting a pattern by processing the information stored in the image memory units 126 and 127. The aforementioned detector-processor means may be the camera control units 117 and 118 or may be established in the system controller 116. As for the quantization accuracy of the analog-to-digital conversion, the accuracy or the image signal gain is set so as to satisfy the condition that the average change be 1 or greater per pixel in the sloped (decreasing and increasing) sections generated on both sides of a pattern (valley). The detection signal patterns (valleys) in the image memory units are characterized in that each has on either side an increasing section and a decreasing section having widths nearly equal to a standard width $W_P$ and that the increase and the decrease in these sections are of magnitudes which are nearly equal to a standard value $D_P$. When a random noise of frequency shorter than that of the detection signal pattern (valley) is contained as shown in FIG. 16a, a smoothing process is effected by an appropriate space operator as shown in FIG. 16b.

The pattern detection process includes the following three steps, that of creating a slope data table, that of extracting an optimum pattern and that of identifying a pattern part. By the slope data table is meant a data table registering the starting address $A_i$, the magnitude of increase $U_i$ or decrease $D_i$, and the width of increasing or decreasing section $W_i$ regarding continuously increasing or decreasing sections from the one-dimensional data string representing an input signal in the image memory units. This is obtained by sequentially comparing a one-dimensional datum $Y_j$ with one immediately before ($Y_{j-1}$). If the magnitude of increase or decrease $W_i$ is less than a certain minimum value $W_{min}$, however, it is regarded as a negligible noise component and is not registered in the slope table. This is in order to make use of the table areas effectively and to shorten the processing time by reducing the number of data to be processed. An example of data table processing is shown in FIG. 16c.

The so-called characteristic space method is applied for extracting an optimum pattern by using as characteristic quantities the magnitude of increase $U_i$ and the width $W_i$ of the increasing section in the case of an increase and the magnitude of decrease $D_i$ and the width $W_i$ of the decreasing section in the case of a decrease. Thus, the deviation of the detected pattern from the standard pattern is $$d_u = \{[a_1(W_P - W_i)]^2 + [a_2(D_P - U_i)]^2\}^{\frac{1}{2}}$$

for an increasing section and $$d_d = \{[a_1(W_P - W_i)]^2 + [a_2(D_P - D_i)]^2\}^{\frac{1}{2}}$$

for a decreasing section.

In an ideal situation where there is no noise, the image signal from a detection line will include only two valleys representing the two points at which the detection line crosses a V-shaped alignment mark. In general, however, the signal includes many valleys due to noise, but it is assumed unlikely that any of the valleys caused by noise should have a shape resembling that from a standard pattern or widths of increasing and decreasing sections greater than those corresponding to such a standard pattern. Therefore, even if the standard pattern is not known, the valleys in the image signal are analyzed by the width of their increasing and decreasing sections and two of them having the largest widths are selected as most closely resembling the standard pattern. In general, if an alignment mark and a detection mark crosses at N point, the detection signal will idealy contain only N valleys. When there are more than N valleys appearing in the detection signal due to noise, N out of these more than N valleys should be selected by using the same criterion as discussed above. In the above, a situation where N=2 was described.

In the next step, numbers are sequentially assigned as shown in FIG. 16d to the increasing and decreasing sections of the valleys separately in the order of how each resembles that of the standard pattern. Reference being still made to the example above where N=2, two valleys considered most closely resembling the standard pattern are selected and the beginning positions of their decreasing parts are identified as points $P_1$ and $P_1'$, respectively as shown in FIG. 16e. Similarly, the end positions of their decreasing parts are called $P_2$ and $P_2'$. The beginning and end points of their increasing parts are respectively identified as points $P_3$ and $P_3'$, and points $P_4$ and $P_4'$, respectively.

The center position of the valley identified by the Points $P_1$, $P_2$, $P_3$ and $P_4$ of FIG. 16e, for example, can be determined by finding an axis of symmetry for the signal between the higher of the levels $P_2$ and $P_3$ and the lower of the levels of $P_1$ and $P_4$. The center position of the other valley identified by the points $P_1'$, $P_2'$, $P_3'$ and $P_4'$ is similarly determined and these center positions thus obtained are used for the calculation of the position of the mark.

In summary, the present invention makes it possible to position an object highly accurately by using a V-shaped mark adapted to move in correspondence with the position thereof and a detection line for detecting the position of this mark. The position of an alignment mark can be determined accurately by the method of this invention even if the position information image signal of the mark contains noise. While only certain embodiments of the present invention have been described, it will be apparent to those skilled in the art that various changes and modifications may be made therein without departing from the spirit and scope of the present invention as claimed.

What is claimed is:

1. A method of aligning an object with respect to another object at a reference position comprising the steps of providing a first object having a first V-shaped mark which moves in correspondence with the position of said first object, providing a second object having a second V-shaped mark which moves in correspondence with said second object, detecting the position of said first V-shaped mark by a first straight mark detection line to determine the current position of said first object, detecting the position of said second V-shaped mark by a second straight mark detection line to determine the current position of said second object, comparing the results of said steps of detecting positions of said V-shaped marks, judging from the result of said comparing step whether alignment of said first and second objects has been accomplished, and moving said first object if alignment of said first and second objects has not been accomplished according to the result of said judging step.

2. The method of claim 1 wherein said steps of detecting the positions of said first and second V-shaped marks comprise scanning said first and second mark detection lines respectively with a point sensor to obtain an image signal diagram and identifying locations on said diagram where change in signal level is significantly larger.

3. The method of claim 1 wherein said moving step includes the step of keeping said second object stationary.

4. The method of claim 1 wherein said moving step comprises moving said first object such that said first and second V-shaped marks together form a square mark.

5. The method of claim 1 wherein said moving step comprises moving said first object such that the crests of said first and second V-shaped marks match.

6. The method of claim 1 wherein said step of detecting the position of said first V-shaped mark comprises determining positions where said first V-shaped mark crosses said first mark detection line.

7. The method of claim 1 wherein said step of detecting the position of said second V-shaped mark comprises determining positions where said second V-shaped mark crosses said second mark detection line.

8. The method of claim 1 wherein each of said first and second mark detection lines comprises a one-dimensional charge coupled device.

9. The method of claim 1 wherein said moving step comprises calculating the distance by which said first object is moved with respect to said second object.

* * * * *